US011094795B2

(12) United States Patent
Huang

(10) Patent No.: US 11,094,795 B2
(45) Date of Patent: Aug. 17, 2021

(54) SEMICONDUCTOR DEVICE AND METHOD FOR MANUFACTURING THE SAME

(71) Applicant: NANYA TECHNOLOGY CORPORATION, New Taipei (TW)

(72) Inventor: Chun-Shun Huang, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 0 days.

(21) Appl. No.: 16/458,873

(22) Filed: Jul. 1, 2019

(65) Prior Publication Data

US 2020/0161450 A1 May 21, 2020

Related U.S. Application Data

(60) Provisional application No. 62/769,848, filed on Nov. 20, 2018.

(51) Int. Cl.
*H01L 29/66* (2006.01)
*H01L 29/06* (2006.01)
(Continued)

(52) U.S. Cl.
CPC .. *H01L 29/66515* (2013.01); *H01L 21/28052* (2013.01); *H01L 21/28518* (2013.01);
(Continued)

(58) Field of Classification Search
CPC ......... H01L 29/66515; H01L 21/58052; H01L 21/28518; H01L 29/0653; H01L 29/456; H01L 29/4933; H01L 29/665
(Continued)

(56) References Cited

U.S. PATENT DOCUMENTS 5,476,814 A * 12/1995 Ohshima .......... H01L 21/76879
438/641
9,653,594 B2   5/2017 Tsai et al.
(Continued)

FOREIGN PATENT DOCUMENTS

CN   101593753 A   12/2009
CN   102347270 A   2/2012
(Continued)

OTHER PUBLICATIONS

Office Action dated Jan. 20, 2020 related to Taiwanese Application No. 108125571.
(Continued)

*Primary Examiner* — Dzung Tran
(74) *Attorney, Agent, or Firm* — Muncy, Geissler, Olds & Lowe, P.C.

(57) ABSTRACT

The present disclosure provides a semiconductor device. The semiconductor device includes a substrate, a gate electrode, a drain region, a source region, an isolating layer, a plurality of metal contacts, a plurality of conductive plugs, and a contact liner. The gate electrode is disposed on the substrate. The drain region and the source region are disposed in the substrate and on opposite sides of the gate electrode. The isolating layer is disposed over the substrate and the gate electrode. The metal contacts are disposed in the gate electrode, the source region, and the drain region. The conductive plugs are disposed in the isolating layer and electrically coupled to the metal contacts. The contact liner surrounds the conductive plugs. The present disclosure further provides a method for manufacturing the semiconductor device.

10 Claims, 17 Drawing Sheets

(51) Int. Cl.
*H01L 29/45* (2006.01)
*H01L 21/28* (2006.01)
*H01L 21/285* (2006.01)
*H01L 29/49* (2006.01)

(52) U.S. Cl.
CPC ........ *H01L 29/0653* (2013.01); *H01L 29/456* (2013.01); *H01L 29/4933* (2013.01); *H01L 29/665* (2013.01)

(58) Field of Classification Search
USPC .......................................................... 257/384
See application file for complete search history.

(56) References Cited

U.S. PATENT DOCUMENTS

| | | | | |
|---|---|---|---|---|
| 2011/0104893 A1* | 5/2011 | Zhang | ............... | H01L 21/32134 438/653 |
| 2011/0169105 A1* | 7/2011 | Okubo | .................. | H01L 29/517 257/411 |
| 2013/0078800 A1* | 3/2013 | Lai | ........................ | H01L 21/324 438/653 |
| 2013/0193577 A1 | 8/2013 | Tseng et al. | | |
| 2015/0263109 A1* | 9/2015 | Chen | .................. | H01L 21/28518 257/410 |
| 2017/0098609 A1* | 4/2017 | Harrington, III | ..... | H01L 23/535 |
| 2018/0315652 A1* | 11/2018 | Tsai | .................... | H01L 29/6656 |

FOREIGN PATENT DOCUMENTS

| | | |
|---|---|---|
| CN | 104157576 A | 11/2014 |
| CN | 107968118 A | 4/2018 |
| CN | 108257917 A | 7/2018 |
| TW | 201725728 A | 7/2017 |
| TW | 201820457 A | 6/2018 |

OTHER PUBLICATIONS

Office Action dated Jun. 20, 2020 related to Taiwanese Application No. 108125571.
Office Action dated Apr. 28, 2021 in Chinese Application No. 201910721439.6, 9 pages.

* cited by examiner

SEMICONDUCTOR DEVICE AND METHOD FOR MANUFACTURING THE SAME

CROSS REFERENCE TO RELATED APPLICATIONS

This application claims priority of U.S. Provisional Application No. 62/769,848 filed on Nov. 20, 2018 under 35 U.S.C. § 119(e), the entire contents of all of which are hereby incorporated by reference.

TECHNICAL FIELD

The present disclosure relates to a semiconductor device and a method for manufacturing the same, and more particularly, to a metal-oxide-semiconductor (MOS) transistor device and a method for manufacturing the same.

DISCUSSION OF THE BACKGROUND

As integrated circuit structures have become more compact, the need for low resistance metal connections between these structures has increased.

In a metal-oxide-semiconductor transistor device, in general, metal contacts are provided for lowering the contact resistance between electrode regions (i.e., the gate region, the source region, and the drain region) and conductive plugs. However, it is difficult to form the metal contacts in contact with the conductive plugs and the electrode regions at the bottom of contact holes having large aspect ratios, wherein the conductive plugs are disposed in the contact holes.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device. The semiconductor device includes a substrate, a gate electrode, a drain region, a source region, an isolating layer, a plurality of metal contacts, a plurality of conductive plugs, and a contact liner. The gate electrode is disposed on the substrate. The drain region and the source region are disposed in the substrate and on opposite sides of the gate electrode. The isolating layer is disposed over the substrate and the gate electrode. The metal contacts are disposed in the gate electrode, the source region, and the drain region. The conductive plugs are disposed in the isolating layer and electrically coupled to the metal contacts. The contact liner surrounds the conductive plugs.

In some embodiments, the semiconductor device further includes a barrier layer disposed between the conductive plugs and the contact liner.

In some embodiments, the isolating layer includes an underlying dielectric layer and an overlying dielectric layer, wherein the underlying dielectric layer is disposed on the substrate and surrounds the gate electrode, and the overlying dielectric layer is disposed over the underlying dielectric layer and the gate electrode.

In some embodiments, a top surface of one of the plurality of metal contacts in the gate electrode is coplanar with an upper surface of the underlying dielectric layer, and top surfaces of the other metal contacts in the source region and the drain region are coplanar with a front surface of the substrate.

In some embodiments, the metal contacts are metal silicide contacts.

In some embodiments, the semiconductor device further includes a gate dielectric and a gate spacer, wherein the gate dielectric is disposed between the substrate and the gate electrode, and the gate spacer is disposed on sidewalls of the gate electrode and the gate dielectric.

In some embodiments, the semiconductor device further includes a plurality of isolating regions disposed in the substrate to define and electrically isolate one or more active areas comprising the gate electrode, the source region, and the drain region.

In some embodiments, the isolating regions are shallow trench isolation structures.

In some embodiments, the source region and the drain region are doping regions.

In some embodiments, the contact liner has a uniform thickness.

Another aspect of the present disclosure provides a method for manufacturing a semiconductor device. The method includes steps of providing a substrate; forming a gate electrode over the substrate; forming a source region and a drain region in the substrate; depositing an isolating layer over the substrate and the gate electrode; forming a plurality of contact holes in the isolating layer to expose the gate electrode, the source region, and the drain region; forming a plurality of metal contacts in the gate electrode, the source region, and the drain region; depositing a contact liner in the contact holes; and depositing a conductive material in the contact holes, wherein the conductive material is surrounded by the contact liner.

In some embodiments, the forming of the plurality of metal contacts in the gate electrode, the source region, and the drain region includes steps of depositing a metal layer in the contact holes; performing a thermal process to make portions of the metal layer react with the gate electrode and the substrate in the source region and the drain region to form metal contacts; and removing an unreacted metal layer.

In some embodiments, depositing the contact liner on the sidewalls of the isolating layer includes steps of depositing the contact liner over a top surface and on the sidewalls of the isolating layer and top surfaces of the metal contacts, and performing an etching process to remove the portion of the contact liner disposed over the top surfaces of the isolating layer and the metal contacts.

In some embodiments, depositing the isolating layer over the substrate and the gate electrode includes steps of depositing an underlying dielectric layer over the substrate and the gate electrode; performing a polishing process to expose the gate electrode; and depositing an overlying dielectric layer over the underlying layer and the gate electrode.

In some embodiments, the method further includes a step of depositing a barrier layer in the contact holes, wherein the barrier layer is surrounded by the contact liner before the depositing of the conductive material.

In some embodiments, the method further includes steps of depositing a gate dielectric on the substrate before the forming of the gate electrode; and forming a gate spacer on sidewalls of the gate dielectric and the gate electrode after the forming of the gate electrode.

In some embodiments, the method further includes forming a plurality of isolating regions in the substrate to define and electrically isolate an active area comprising the gate electrode, the source region, and the drain region.

In some embodiments, the forming of the plurality of isolating regions includes steps of etching a plurality of trenches in the substrate, and filling the trenches with one or more dielectric materials.

The present disclosure provides a method to facilitate manufacturing the metal contacts at the bottom of the contact holes, while the diameter of the conductive plugs electrically coupled to the metal contacts meets the design rule or the design guide.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
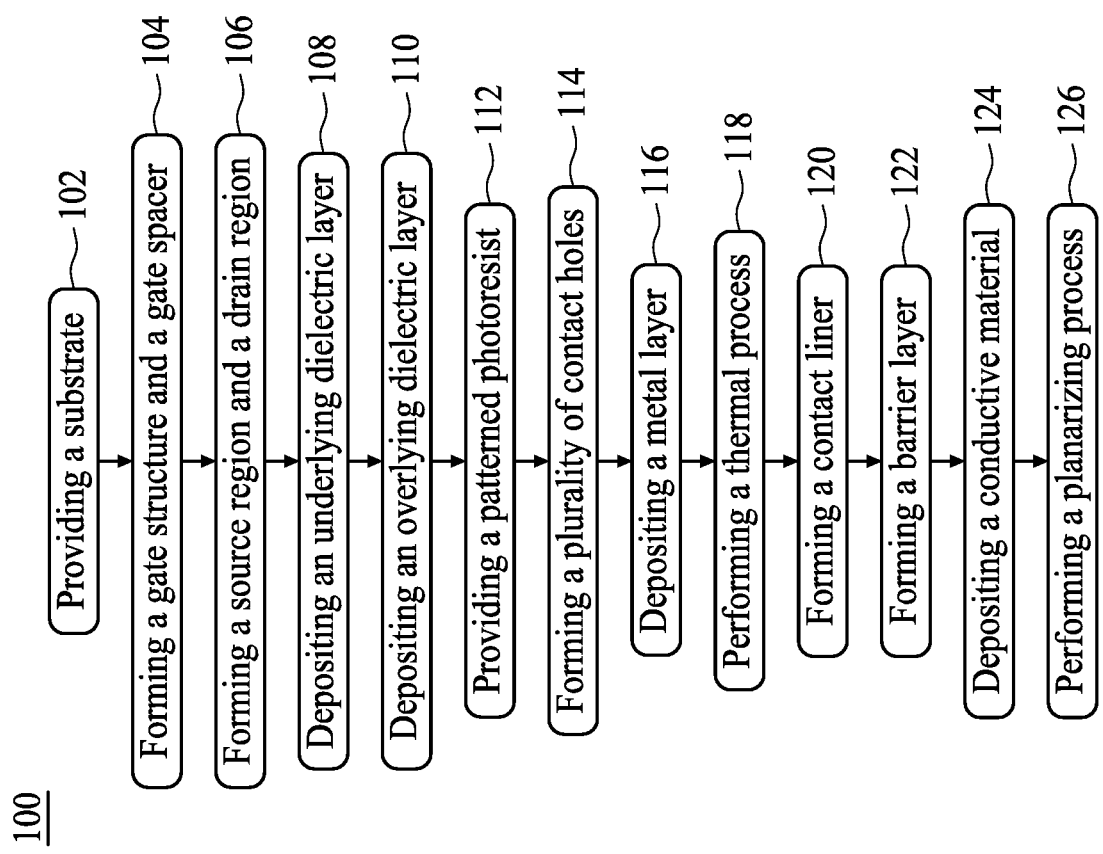
FIG. 1 is a flow diagram illustrating a method for manufacturing a semiconductor device, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further application of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a flow diagram illustrating a method 100 for manufacturing a semiconductor device 200, in accordance with some embodiments of the present disclosure. FIGS. 2 to 16 are schematic diagrams illustrating various fabrication stages constructed according to the method for manufacturing the semiconductor device 200 in accordance with some embodiments of the present disclosure. The stages shown in FIGS. 2 to 16 are also illustrated schematically in the process flow in FIG. 1. In the subsequent discussion, the fabrication stages shown in FIGS. 2 to 16 are discussed in reference to the process steps in FIG. 1.

Figure 2:
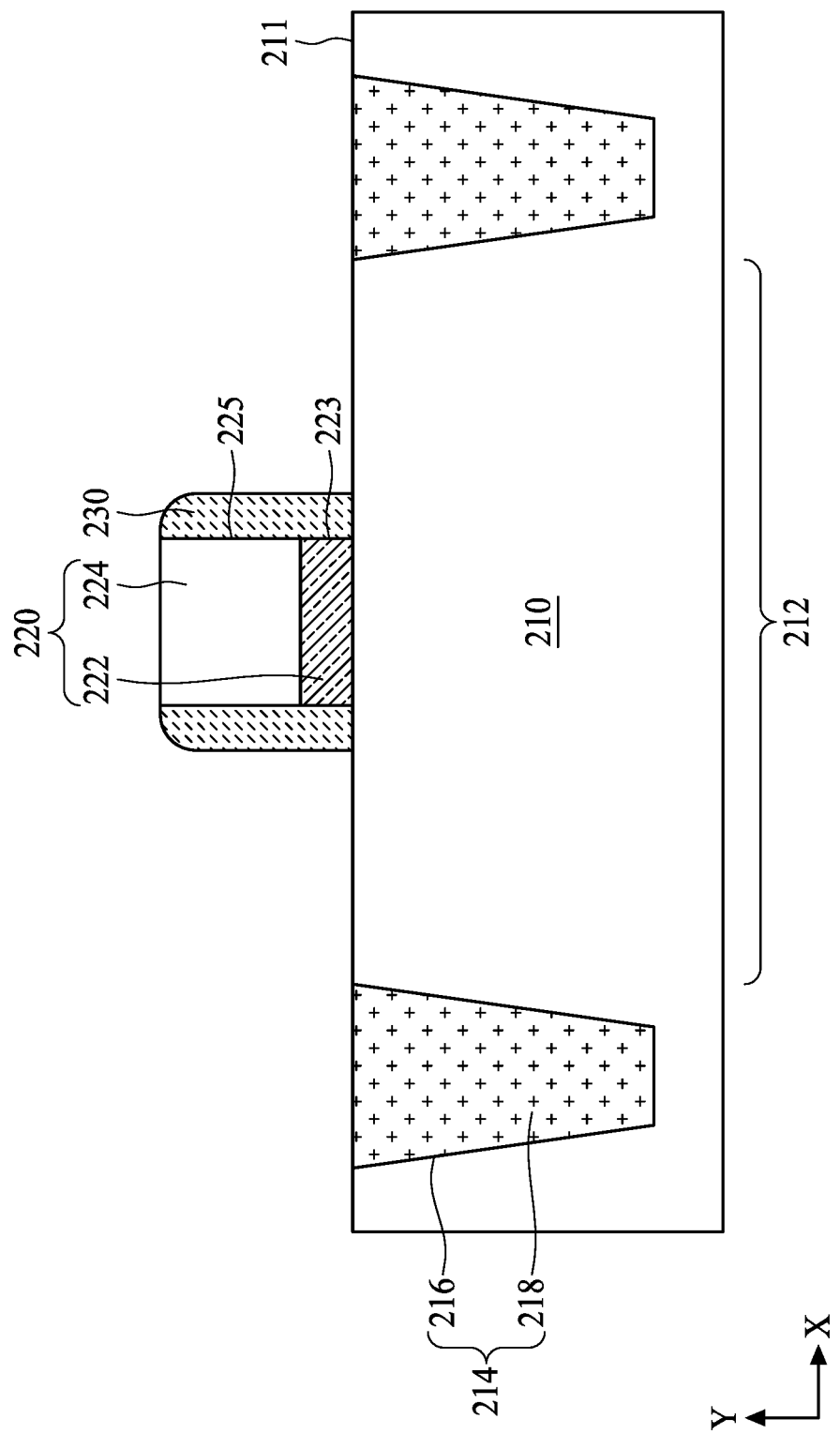
FIGS. 2 through 16 illustrate cross-sectional views of intermediate stages in the formation of a semiconductor device in accordance with some embodiments of the present disclosure.

Referring to FIG. 2, a substrate 210 is provided according to a step 102 in FIG. 1. In some embodiments, the substrate 210 is a semiconductor substrate, such as a silicon substrate. In some embodiments, the substrate 210 includes a plurality of active regions 212 (for simplicity, only one active region 212 is shown in FIG. 2) and a plurality of isolating regions 214. In some embodiments, the isolating regions 214 are formed in the substrate 210 to isolate the active regions 212. In some embodiments, the isolating regions 214 use shallow trench isolation (STI) technology to define and electrically isolate the active regions 212. In some embodiments, the isolating regions 214 are STI regions. In some embodiments, the isolating regions 214 include silicon oxide, silicon nitride, silicon oxynitride, fluoride-doped silicate glass (FSG), a low-K dielectric material, and/or the combination thereof. In some embodiments, the formation of the isolating regions 214 includes patterning the substrate 210 by a photolithography process, etching one or more trenches 216 in the substrate 210 (for example, by a dry etching, a wet etching, and/or a plasma etching process), and filling the trenches 216 (for example, by a chemical vapor deposition process) with one or more dielectric materials 218. In some embodiments, the isolating regions 214 are connected to a front surface 211 of the substrate 210.

Next, in some embodiments, a gate structure 220 and a gate spacer 230 are formed over the substrate 210 according to a step 104 in FIG. 1. In some embodiments, the gate structure 220 includes a gate dielectric 222 disposed on the front surface 211 and a gate electrode 224 over the gate dielectric 222. In some embodiments, the gate dielectric 222 includes silicon dioxide. In some embodiments, the gate dielectric 222 is formed by a chemical vapor deposition (CVD) process, an atomic layer deposition (ALD) process, a thermal oxidation process, or the like. In some embodiments, the gate electrode 224 includes polycrystalline silicon (polysilicon). In some embodiments, the gate electrode 224 is formed by a CVD process, a physical vapor deposition (PVD) process, an ALD process, or other suitable process. In some embodiments, the formation of the gate dielectric 222 and the gate electrode 224 includes forming a blanket gate dielectric layer over the substrate 210 and a blanket gate electrode layer over the blanket gate dielectric layer, and then performing a patterning process and an etching process to remove portions of the blanket gate dielectric layer and blanket gate electrode layer. Accordingly, the gate dielectric 222 and the gate electrode 224 are formed.

In some embodiments, the gate spacer 230 is disposed on the front surface 211 of the substrate 210, sidewalls 223 of the gate dielectric 222, and sidewalls 225 of the gate electrode 224. In some embodiments, the gate spacer 230 is formed by depositing a dielectric layer, using a CVD process, to cover the front surface 211, the gate structure 220, and the gate dielectric 224, and then patterning the dielectric layer using an anisotropic etching process to remove horizontal portions of the dielectric layer, while the vertical portion of the dielectric layer on the sidewalls 223 and 225 of the gate dielectric 222 and the gate electrode 224 is left to form the gate spacer 230. In some embodiments, the gate spacer 230 includes oxide or nitride. In some embodiments, the gate spacer 230 includes silicon dioxide or silicon nitride.

Figure 3:
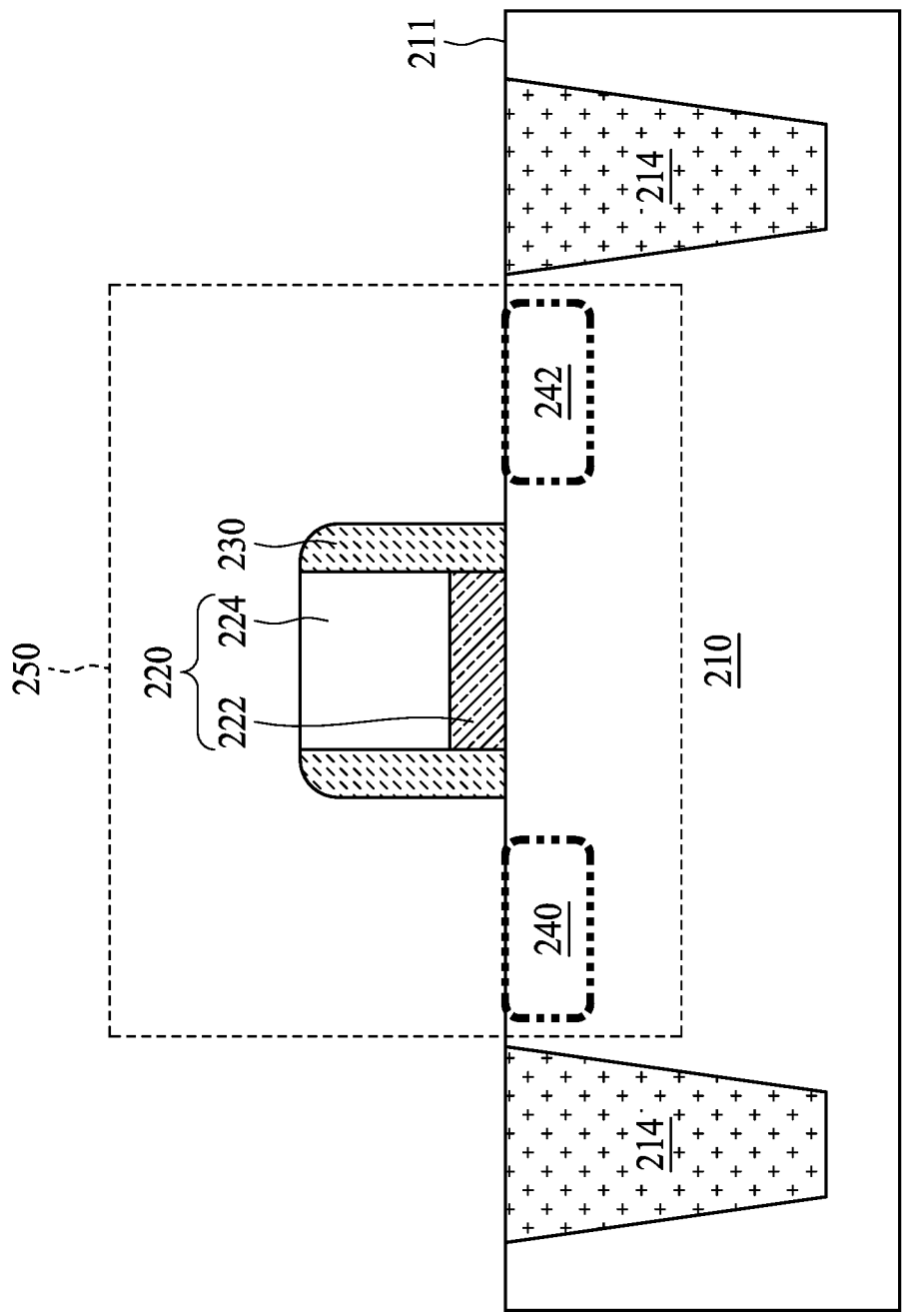

Referring to FIG. 3, in some embodiments, a source region 240 and a drain region 242 are formed in the substrate 210 according to a step 106 in FIG. 1. In some embodiments, the source region 240 and the drain region 242 are disposed on opposite sides of the gate electrode 224. In some embodiments, the formation process of each of the source region 240 and the drain region 242 includes forming a photoresist on the front surface 211, and then performing an implantation to form the source region 240 and the drain region 242 in the substrate 210. Accordingly, a metal-oxide-semiconductor (MOS) transistor 250 including the gate electrode 224, the source region 240, and the drain region 242 is formed. In some embodiments, the source region 240 and the drain region 242 are connected to the front surface 211.

Figure 4:
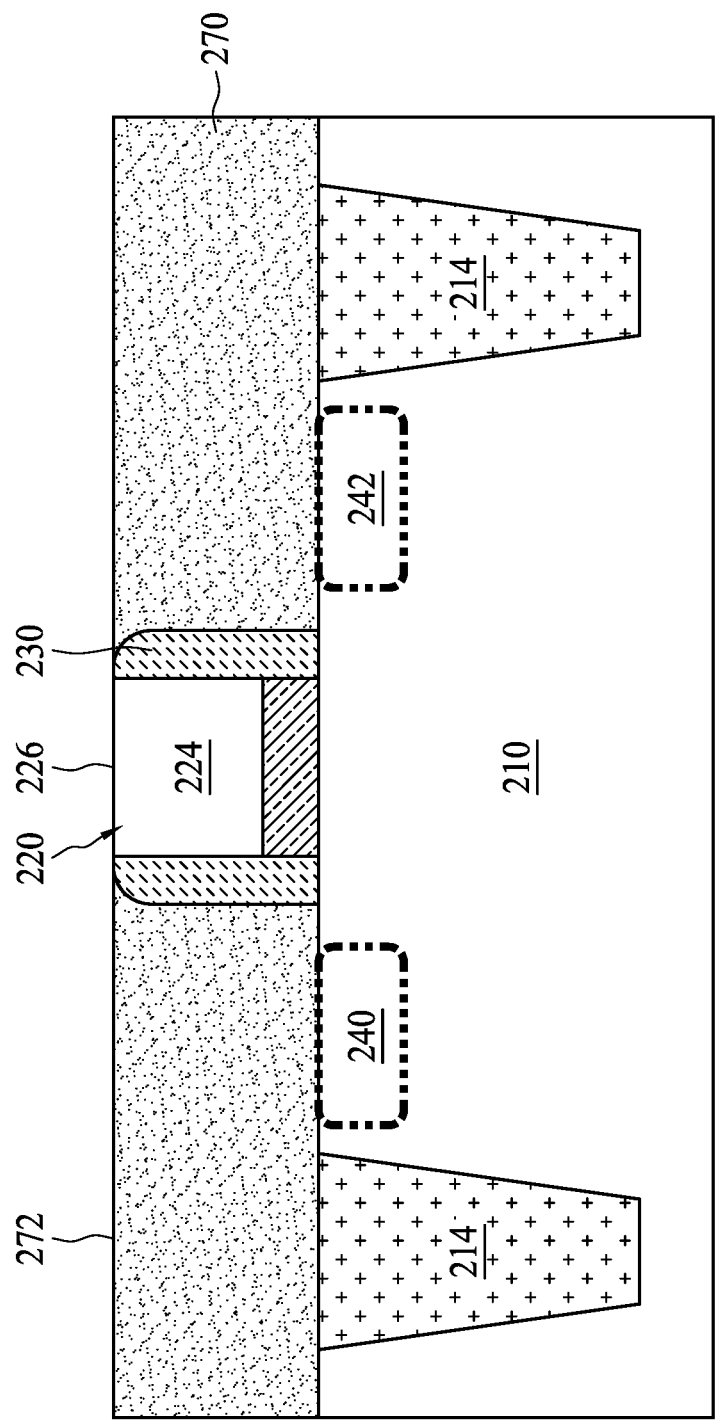

Referring to FIG. 4, in some embodiments, an underlying dielectric layer 270 is deposited over the MOS transistor 250 according to a step 108 in FIG. 1. In some embodiments, the underlying dielectric layer 270 covers the substrate 210, the gate structure 220, and the gate spacer 230. In some embodiments, the underlying dielectric layer 270 includes oxide. In some embodiments, the underlying dielectric layer 270 is a spin-on dielectric layer, using spin-on coating technology. In some embodiments, a chemical mechanical polishing (CMP) process is used to provide a planar topography such that a top surface 272 of the underlying dielectric layer 270 is approximately coplanar with an upper surface 226 of the gate electrode 224. In some embodiments, the upper surface 226 of the gate electrode 224 is exposed through the underlying dielectric layer 270.

Figure 5:
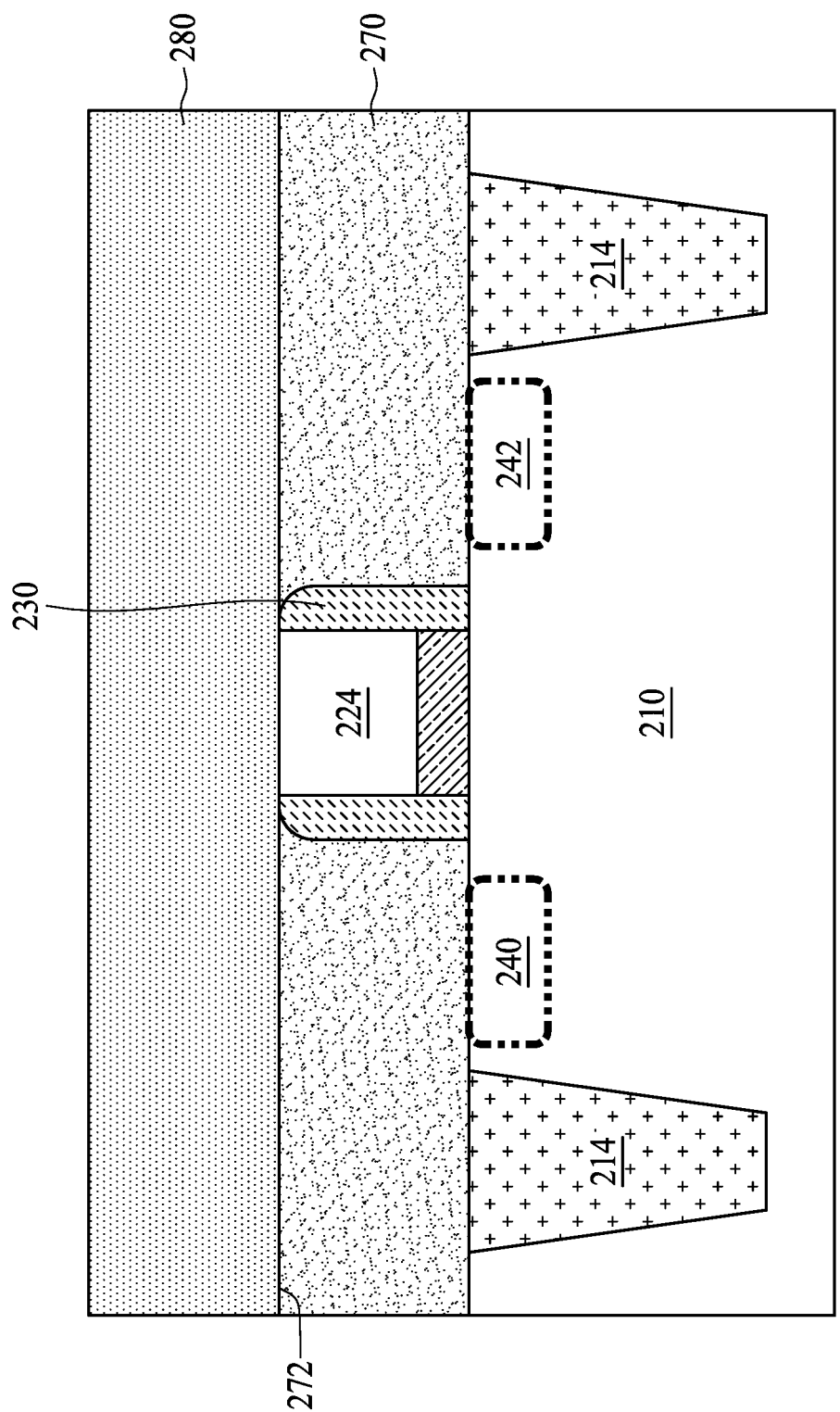

Referring to FIG. 5, in some embodiments, an overlying dielectric layer 280 is deposited over the underlying dielectric layer 270 according to a step 110 in FIG. 1. In some embodiments, the overlying dielectric layer 280 includes oxide. In some embodiments, the overlying dielectric layer 280 covers the underlying dielectric layer 270 and the gate electrode 224. In some embodiments, the overlying dielectric layer 280 is formed by a CVD process.

Figure 6:
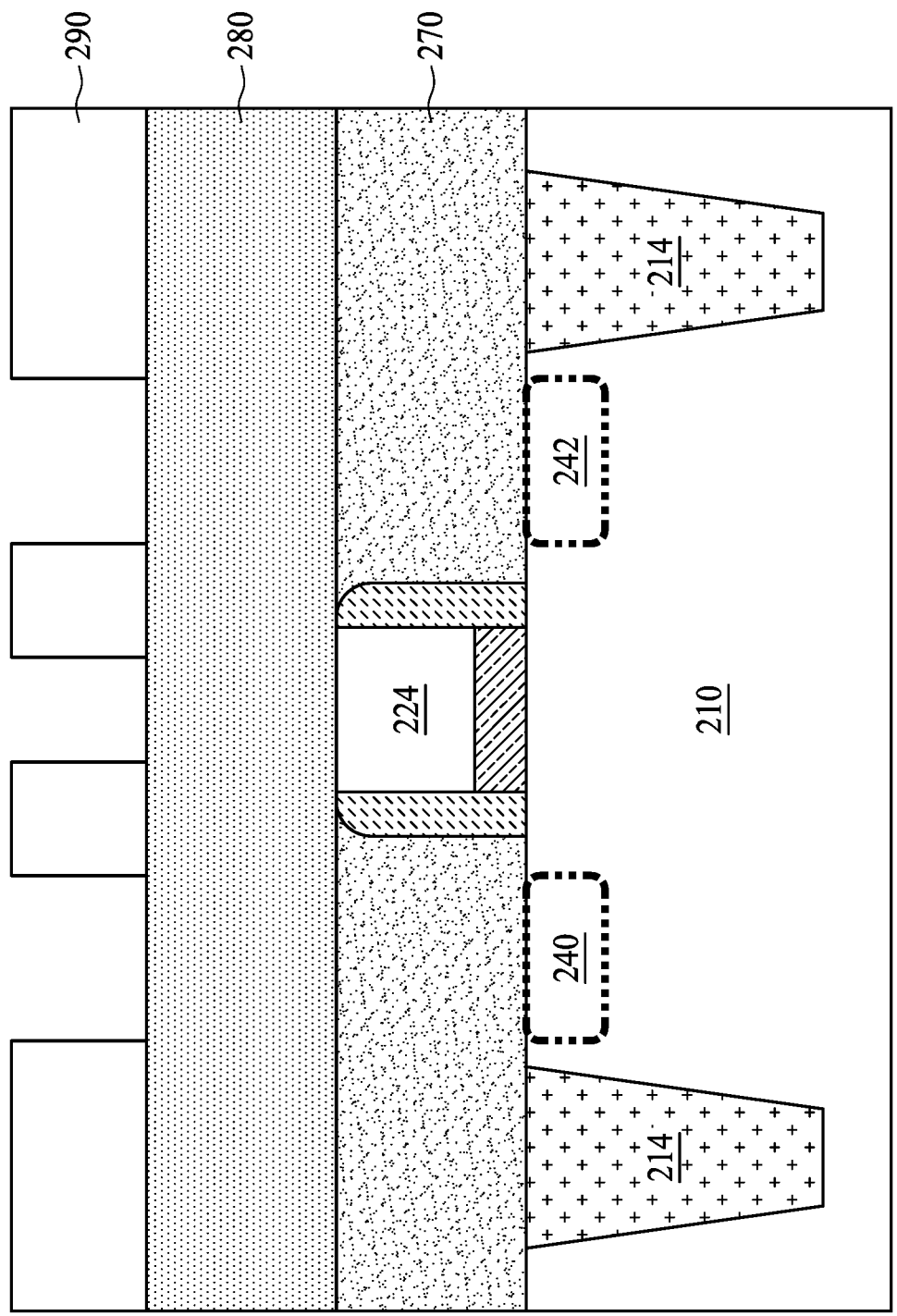

Referring to FIG. 6, a patterned photoresist 290 is provided on the overlying dielectric layer 280 according to a step 112 in FIG. 1. In some embodiments, the patterned photoresist 290 is formed by disposing an unpatterned photoresist layer to fully cover the overlying dielectric layer 280, then removing portions of the unpatterned photoresist layer in accordance with a predefined pattern; the remaining portion of the unpatterned photoresist layer forms the patterned photoresist 290.

Figure 7:
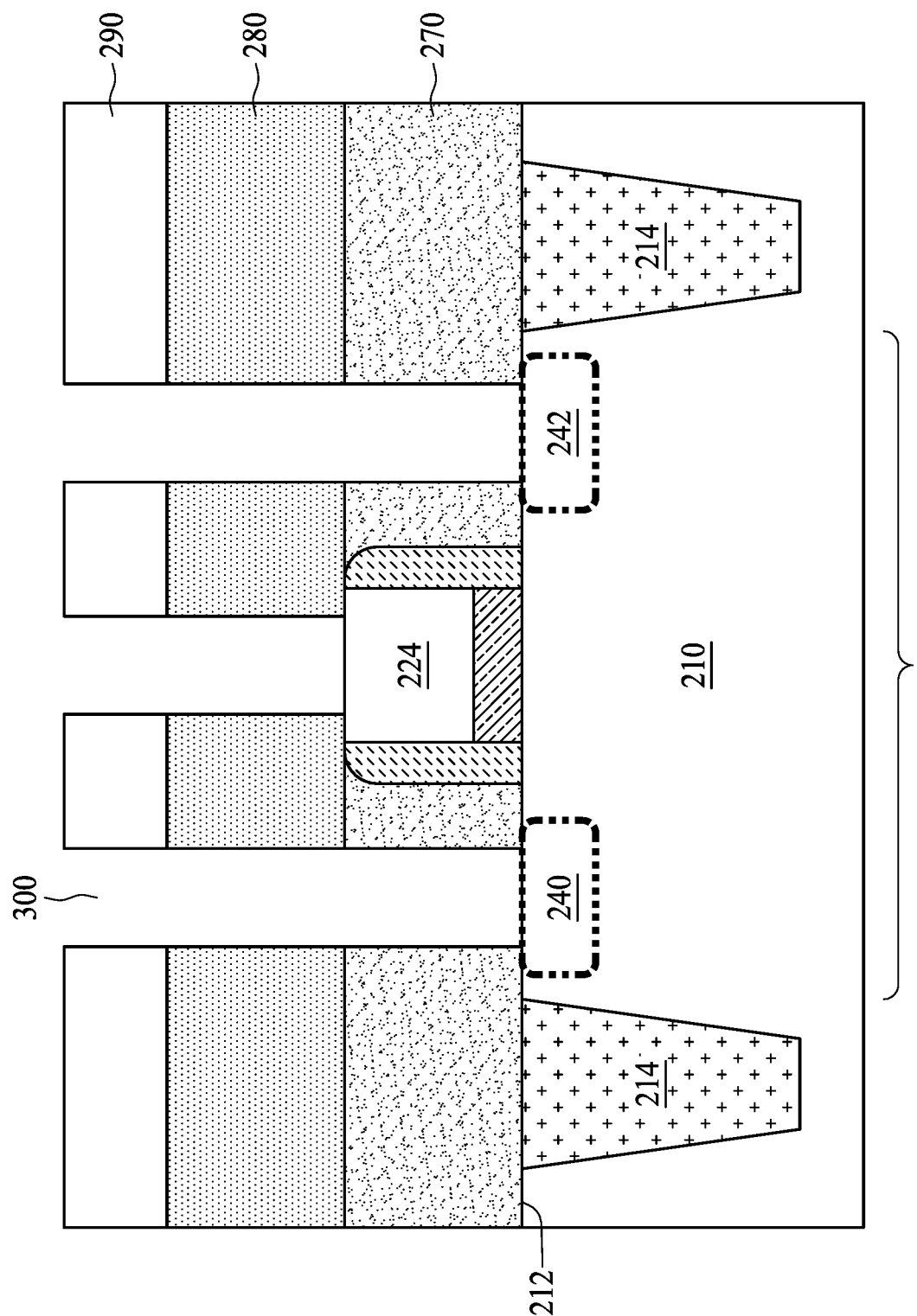
Figure 8:
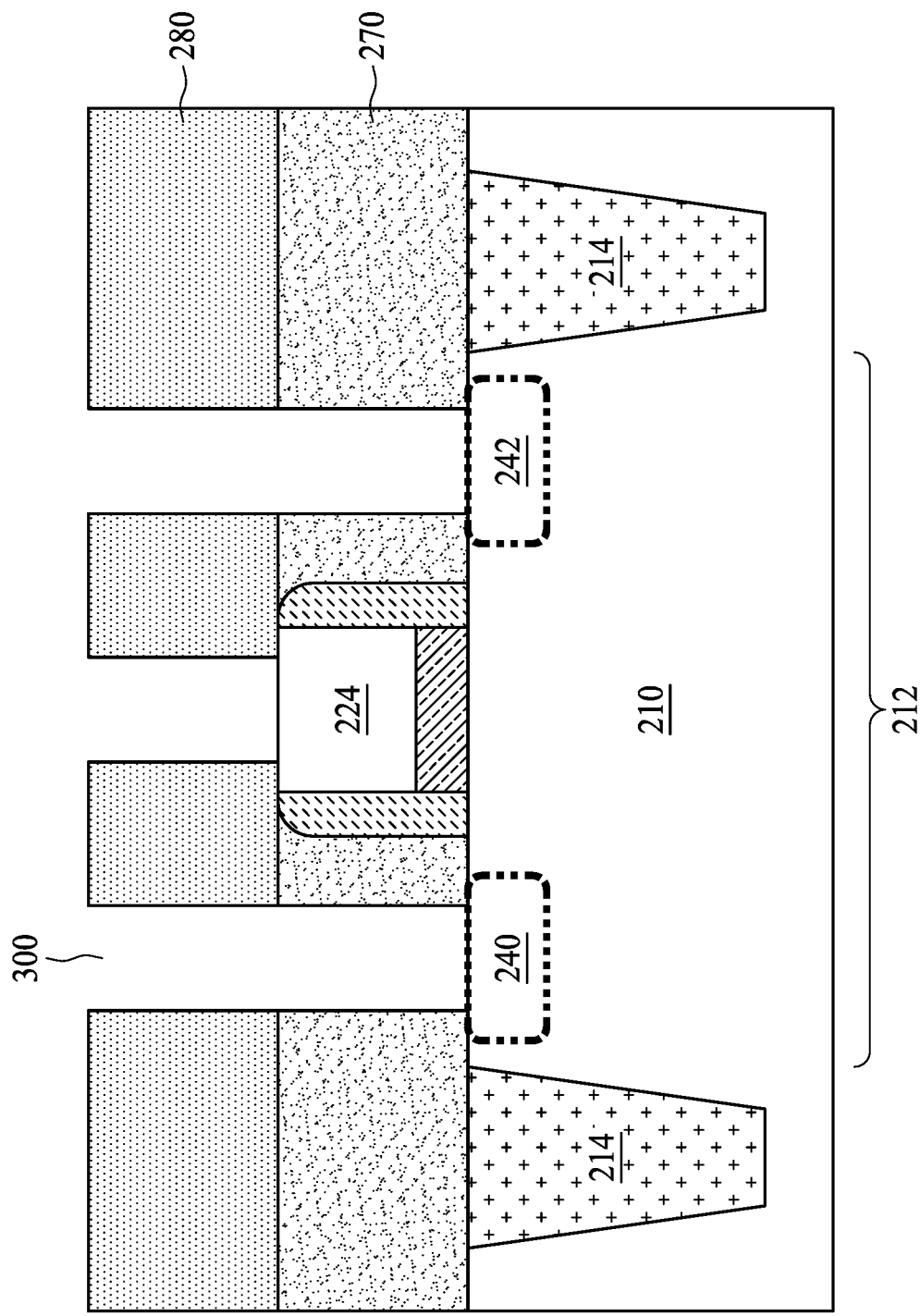

Referring to FIG. 7, an etching process is performed to form a plurality of contact holes 300 according to a step 114 in FIG. 1. In some embodiments, the etching process uses the patterned photoresist 290 to define an area to be etched and to protect other regions of the overlying dielectric layer 280 and the underlying dielectric layer 270. In some embodiments, after the etching process is performed, the overlying dielectric layer 280 and the underlying dielectric layer 270 remain only in portions that are below the patterned photoresist 290. In some embodiments, unnecessary portions of the overlying dielectric layer 280 and the underlying dielectric layer 270 are etched away using the patterned photoresist 290 as a mask. In some embodiments, the contact holes 300 are formed penetrating through the overlying dielectric layer 280 (and the underlying dielectric layer 270). In some embodiments, the contact holes 300 are formed in the active region 212. In some embodiments, the gate electrode 224 and portions of the front surface 211, connected to the source region 240 and the drain region 242, are exposed to the contact holes 300. In some embodiments, the etching process includes a wet etching process, a dry etching process, or the combination thereof. In some embodiments, the patterned photoresist 290 is removed after the forming of the contact holes 300, as shown in FIG. 8.

Figure 9:
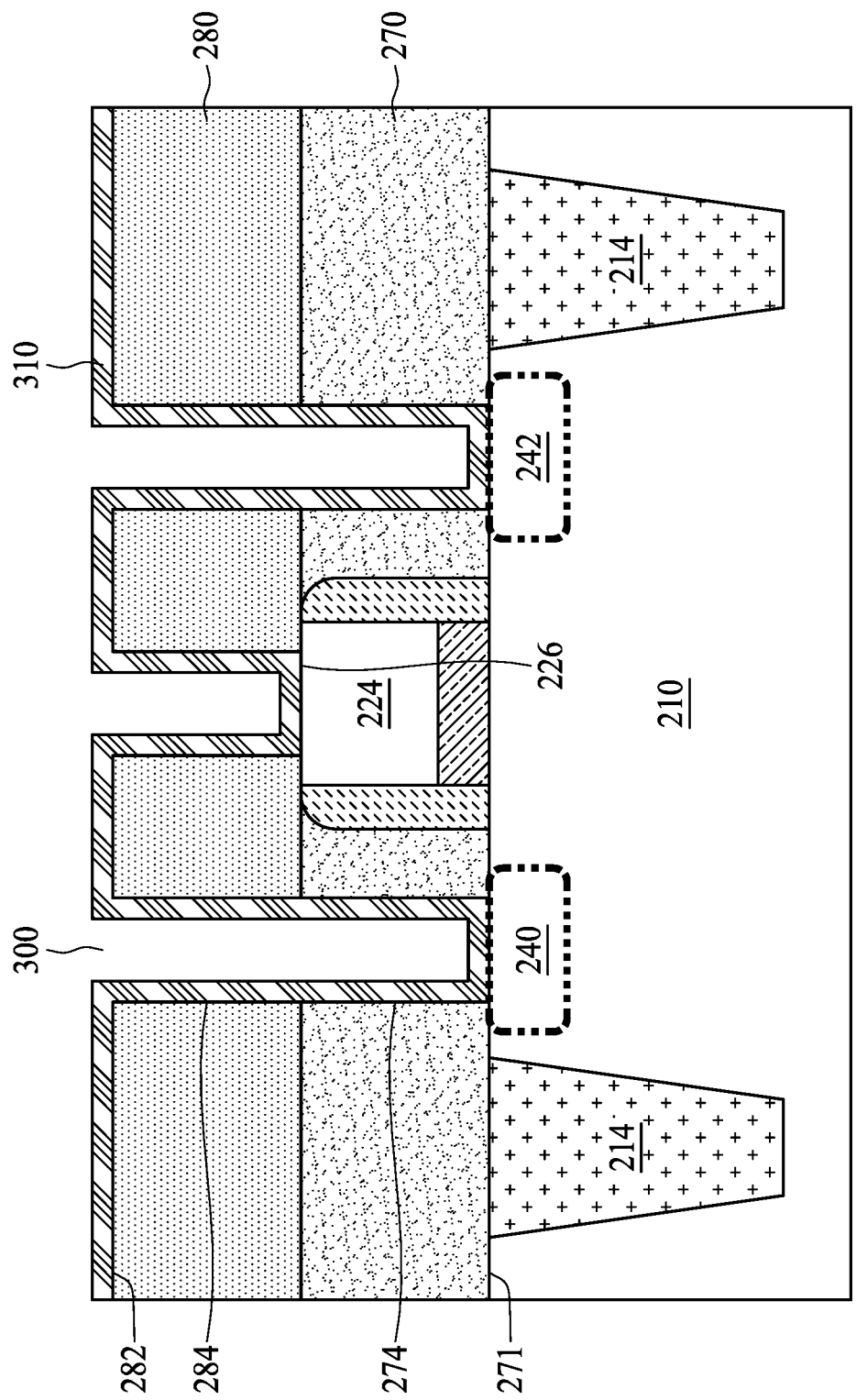

Referring to FIG. 9, in some embodiments, a metal layer 310 is deposited over the underlying dielectric layer 270, the overlying dielectric layer 280 and in the contact holes 300 according to a step 116 in FIG. 1. In some embodiments, the metal layer 310 is disposed on the upper surface 226 of the gate electrode 224, on the sidewall 274 of the underlying dielectric layer 270, the sidewall 284 of the overlying dielectric layer 280, and on a top surface 282 of the overlying dielectric layer 280. In some embodiments, the metal layer 310 has a uniform thickness. In some embodiments, the metal layer 310 includes titanium. In some embodiments, the metal layer 310 includes cobalt.

Figure 10:
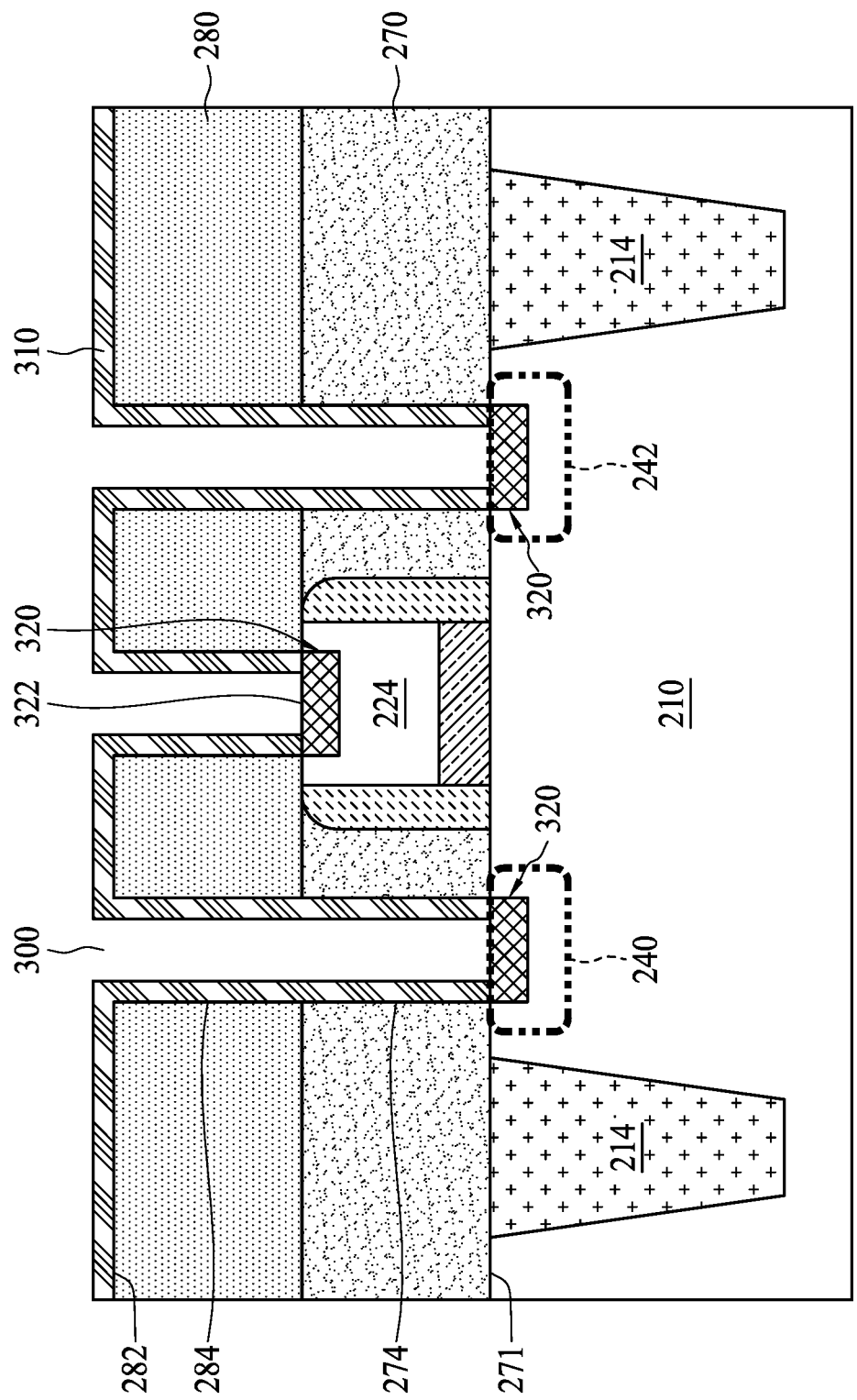
Figure 11:
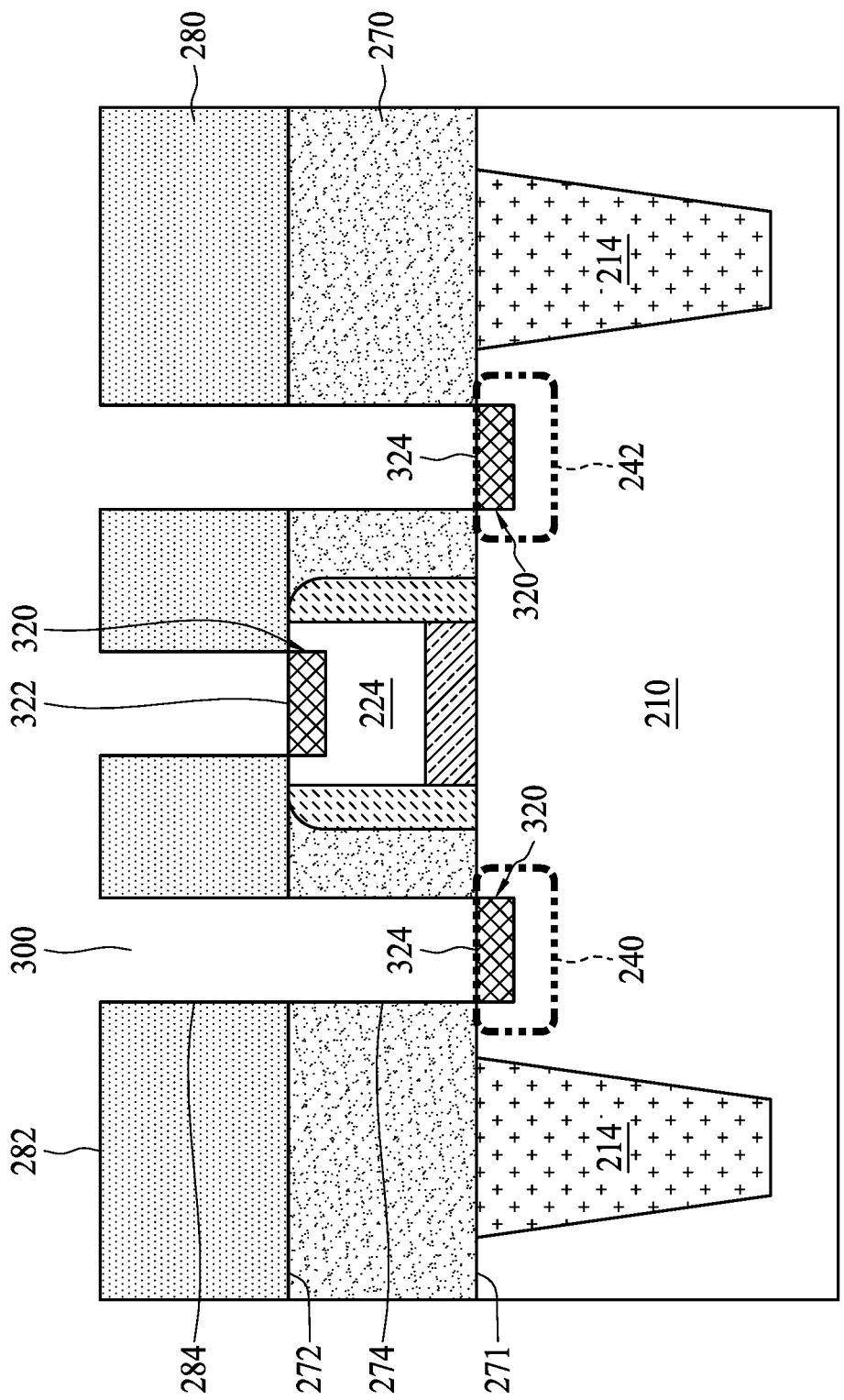

Referring to FIG. 10 a thermal process is performed to at least make portions of the metal layer 310 react with the gate electrode 224 and the substrate 210 in the source region 240 and the drain region 242 to form metal contacts 320 according to a step 118 in FIG. 1. In some embodiments, the metal contacts 320 are metal silicide contacts. In some embodiments, the thermal process utilized to form the metal contacts 320 is preferably a rapid thermal annealing (RTA) process. In some embodiments, after the forming of the metal contacts 320, an unreacted metal layer 310, disposed over the top surface 282 and on the sidewalls 274 and 284, is removed using a wet etching process, as shown in FIG. 11. Referring to FIG. 11, in some embodiments, the metal contact 320 located in the gate electrode 224 is formed by reacting the metal layer 310 with the gate electrode 224, while the metal contacts 320 located in the source region 240 and the drain region 242 are formed by reacting the metal layer 310 with the substrate 210. In some embodiments, the metal contacts 320 include titanium silicide or cobalt silicide, wherein the cobalt silicide has a contact resistance lower than that of the titanium silicide. In some embodiments, a top surface 322 of the metal contact 320 buried in the gate electrode 224 is coplanar with the top surface 272 of the underlying dielectric layer 270. In some embodiments, top surfaces 324 of the metal contacts 320 buried in the source region 240 and the drain region 242 are coplanar with the front surface 211. In some embodiments, the metal silicide contacts provide greater electrical conductivity than contacts without silicide, at the interfaces between the substrate 210 and conductive plugs (as will be described later) and between the gate electrode 224 and the conductive plugs.

Figure 12:
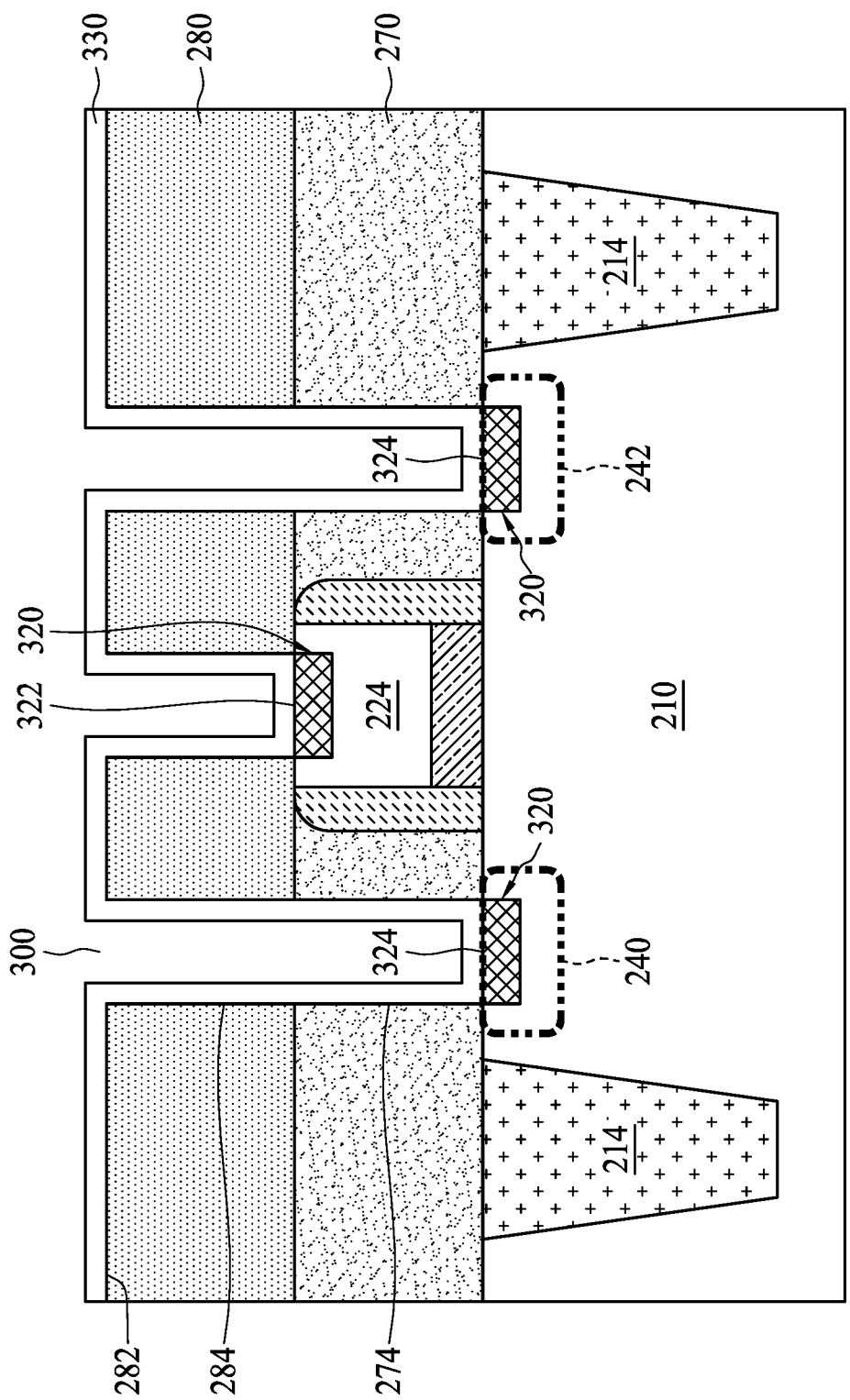

Referring to FIG. 12, in some embodiments, a contact liner 330 is deposited over the overlying dielectric layer 280 and in the contact holes 300 according to a step 120 in FIG. 1. In some embodiments, the contact liner 330 is disposed on the top surface 282 of the overlying dielectric layer 280, top surfaces 322 and 324 of the metal contacts 320, and on the sidewalls 274 and 284 of the underlying dielectric layer 270 and the overlying dielectric layer 280. In some embodiments, the contact liner 330 has a uniform thickness. In some embodiments, the contact liner 330 includes nitride. In some embodiments, the contact liner 330 includes silicon nitride.

Figure 13:
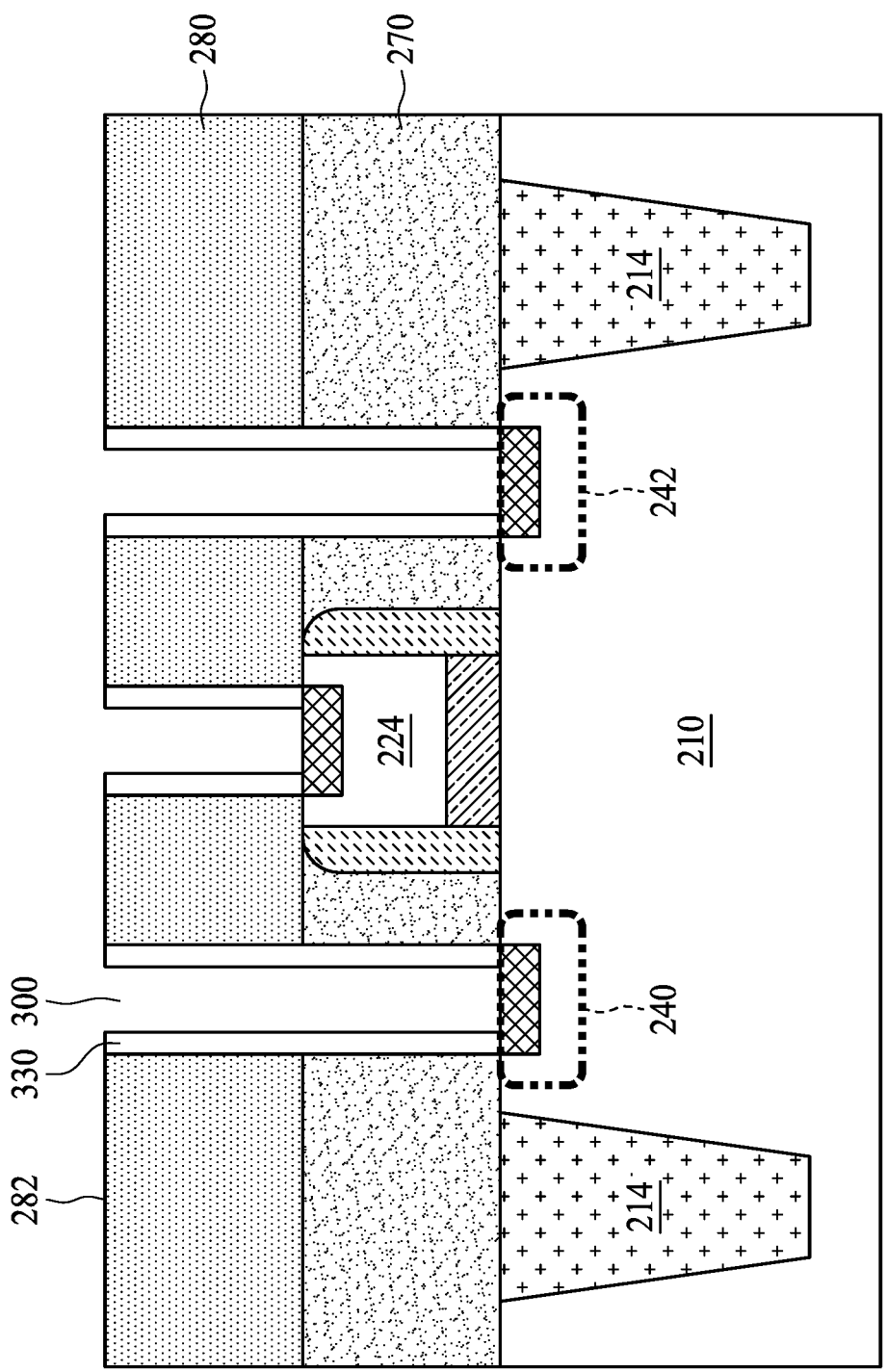

Referring to FIGS. 12 and 13, in some embodiments, a portion of the contact liner 330 is removed. In some embodiments, the portion of the contact liner 330 disposed on the top surface 282 and the metal contacts 320 is removed, while the portion of the contact liner 330 disposed on the sidewalls 274 and 284 is left. In some embodiments, the portion of the contact liner 330 is removed using an anisotropic etching process. In some embodiments, the top surface 282 and the metal contacts 320 are exposed through the contact liner 330 after the performing of the etching process. In some embodiments, the remaining portion of the contact liner 330 is used for reducing a diameter of each of the contact holes 300 for forming conductive plugs, as will be described later. Specifically, the contact holes 300 for filling the conductive plug are initially formed with a diameter greater than that listed on the design rule or design guide, in order to allow for fabrication of the metal contacts 320, and the contact liner 330 is subsequently used for reducing the diameter of the contact holes 330 the meet the requirement of the design rule or design guide.

Figure 14:
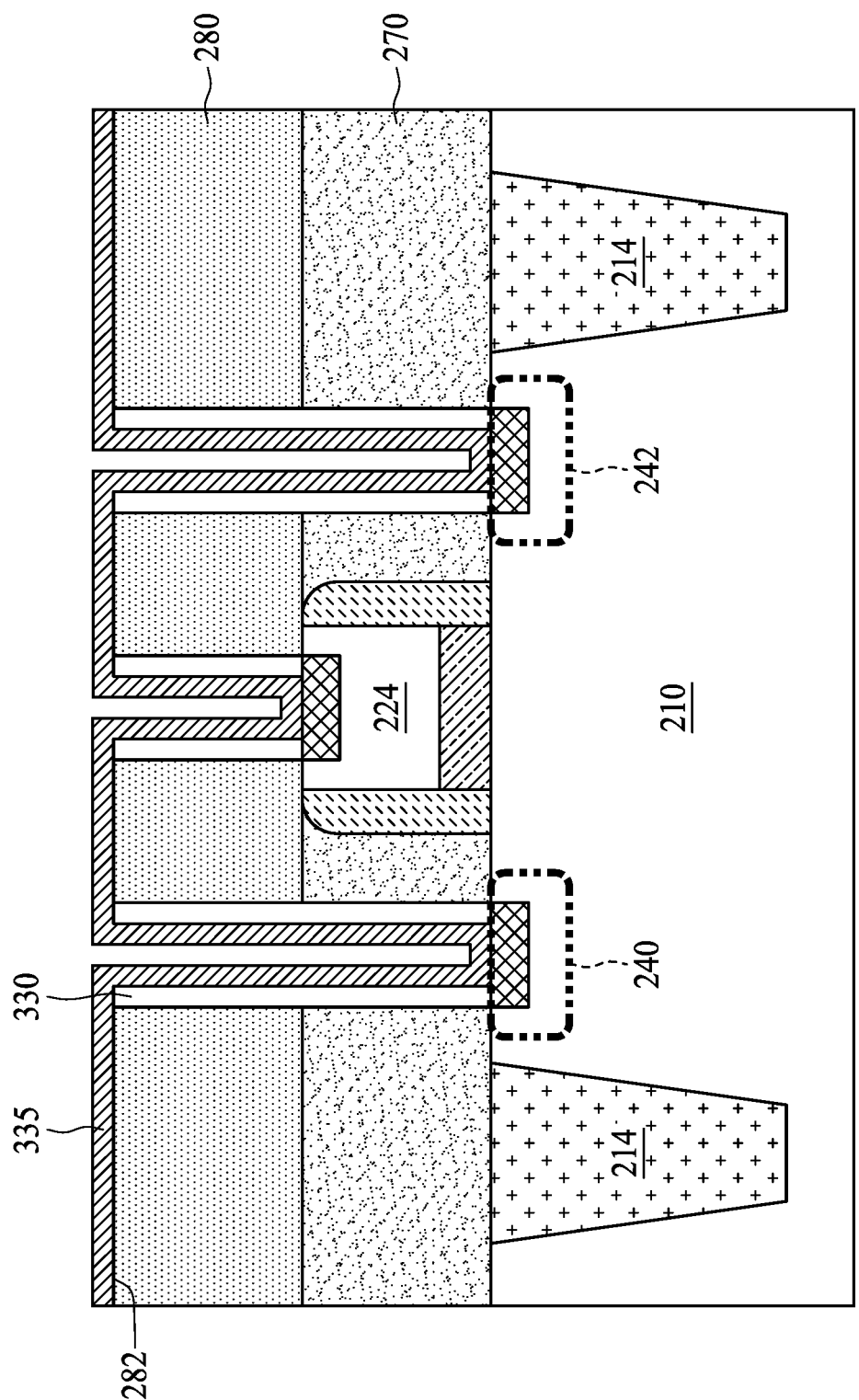

Referring to FIG. 14, in some embodiments, a barrier layer 335 is optionally deposited over the overlying dielectric layer 280 and in the contact holes 300, wherein the barrier layer 335 is surrounded by the contact liner 330, according to a step 122 in FIG. 1. In some embodiments, the barrier layer 335 has a uniform thickness. In some embodiments, the barrier layer 335 covers the top surface 282 of the overlying dielectric layer 280 and the contact liner 330. In some embodiments, the barrier layer 335 includes titanium.

Figure 15:
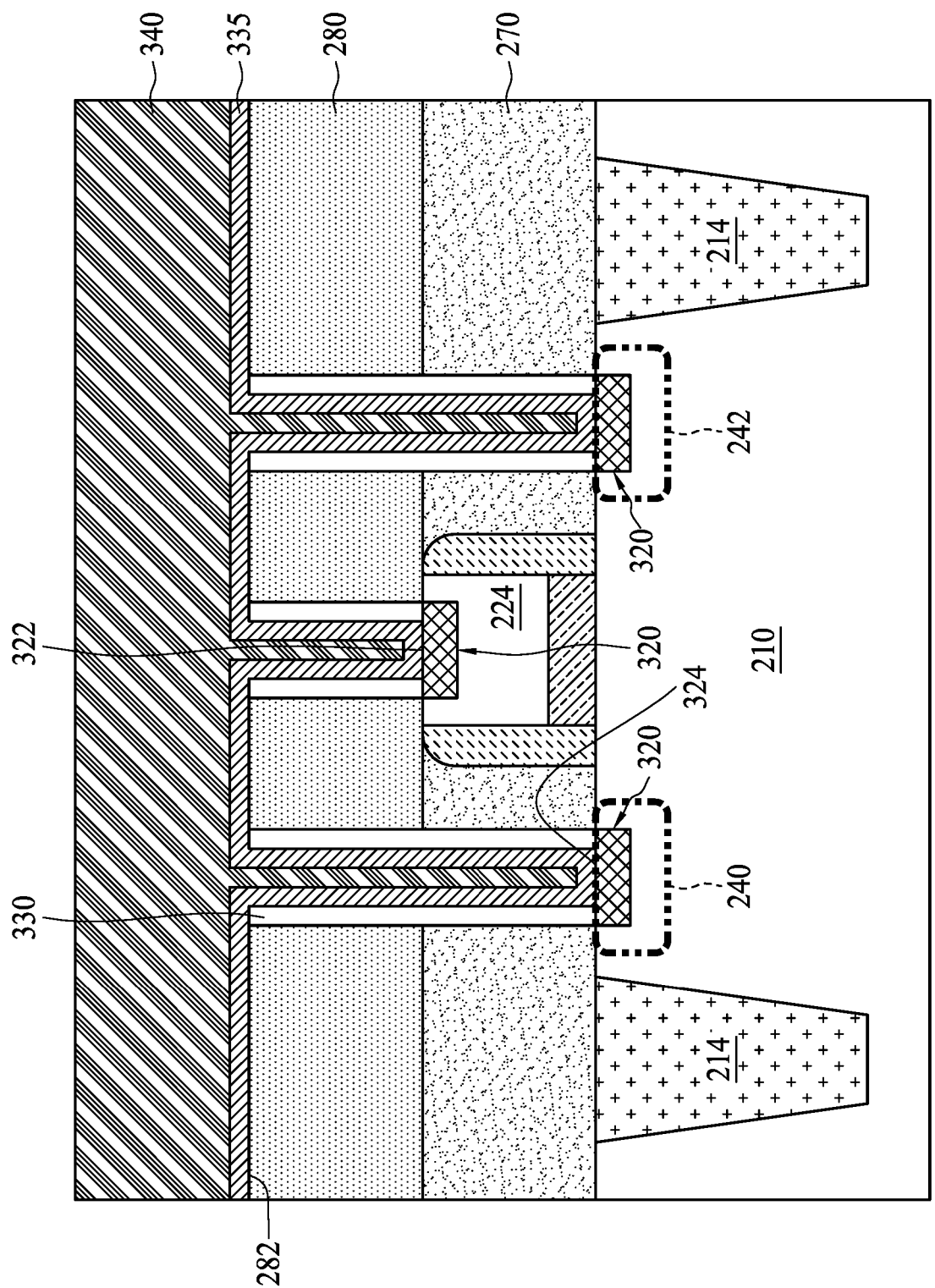

Referring to FIG. 15, in some embodiments, a conductive material 340 is deposited over the barrier layer 335 and in the contact holes 300 according to a step 124 in FIG. 1. In some embodiments, the conductive material 340 has a thickness sufficient to fill the contact holes 300. In some embodiments, the conductive material 340 includes tungsten. In some embodiments, the conductive material 340 includes copper. In some embodiments, the conductive material 340 is electrically coupled to the metal contacts 320 through the barrier layer 335.

Figure 16:
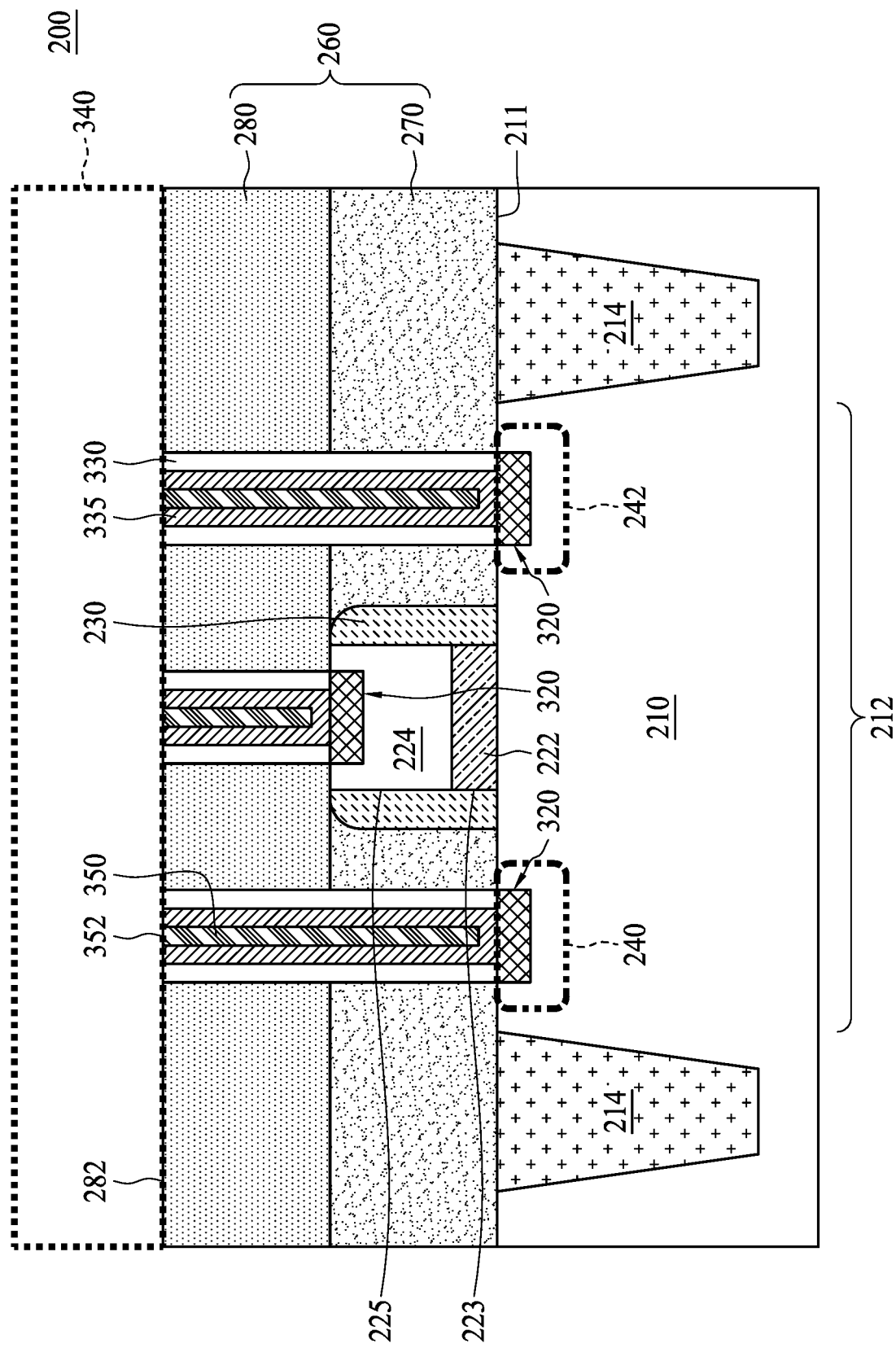

Referring to FIG. 16, in some embodiments, a planarizing process is performed according to a step 126 in FIG. 1. Accordingly, the semiconductor device 200 is formed. In some embodiments, the planarizing process is performed on the semiconductor device 200 to remove excess portions of the conductive material 340 over the top surface 282, while the remaining portions of the conductive material 340 form a plurality of conductive plugs 350 surrounded by the contact liner 340. In some embodiments, an end surface 352 of each of the conductive plugs 350 is coplanar with the top surface 282, and the other end surface 354 thereof is electrically coupled to the metal contact 320 through the barrier layer 335. In some embodiments, the planarizing process includes a chemical mechanical polishing (CMP) process.

Figure 17:
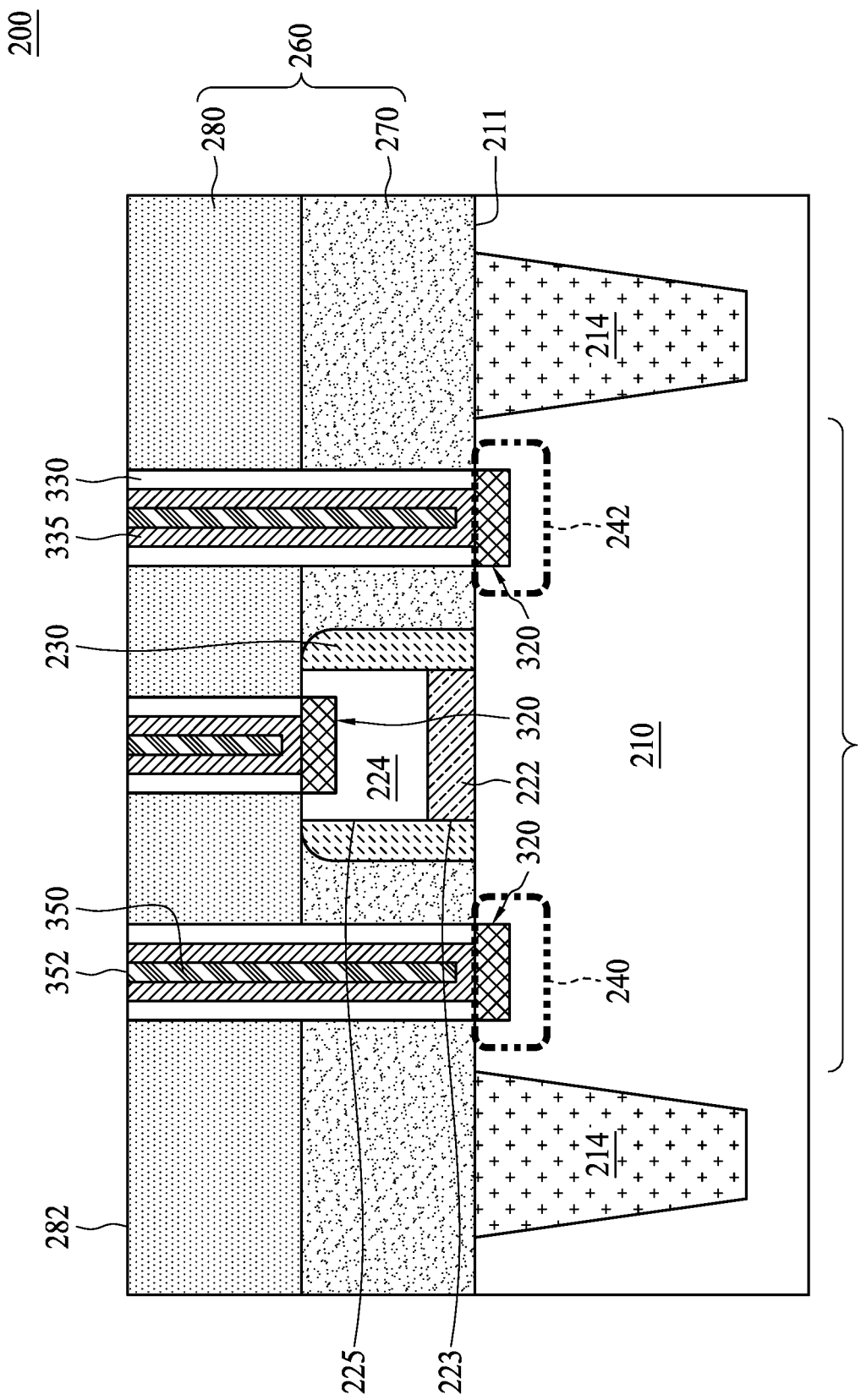
FIG. 17 illustrates cross-sectional views of a semiconductor device, in accordance with some embodiments of the present disclosure.

FIG. 17 is a cross-sectional view of a semiconductor device 200 in accordance with some embodiments of the present disclosure. Referring to FIG. 17, in some embodiments, the semiconductor device 200 includes a substrate 210, a gate electrode 224, an isolating layer 260, a plurality of metal contacts 320, a contact liner 330, and a plurality of conductive plugs 350. In some embodiments, the substrate 210 includes a source region 240 and a drain region 242 disposed therein. In some embodiments, the gate electrode 224 is disposed on the substrate 210, and the source region 240 and the drain region 242 are disposed on opposite sides of the gate electrode 224. In some embodiments, the isolating layer 260 covers the substrate 210 and the gate electrode 224. In some embodiments, the metal contacts 320 are disposed in the gate electrode 224, the source region 240, and the drain region 242. In some embodiments, the conductive plugs 350 are disposed in the isolating layer 260 and electrically coupled to the metal contacts 320. In some embodiments, the contact liner 330 surrounds the conductive plugs 350. In some embodiments, the isolating layer 260 includes an underlying dielectric layer 270 disposed over the substrate 210 and surrounding the gate electrode 224, and an overlying dielectric layer 280 disposed over the underlying dielectric layer 270 and the gate electrode 224.

In some embodiments, the semiconductor device 200 further includes a gate dielectric 222 disposed between the substrate 210 and the gate electrode 224, and a gate spacer 230 disposed in the isolating layer 260 and on sidewalls 223 and 225 of the gate dielectric 222 and the gate electrode 224. In some embodiments, the semiconductor device 200 further includes a barrier layer 335 disposed between the contact liner 330 and the conductive plugs 350. In some embodiments, the semiconductor device 200 further includes a plurality of isolating regions 214 disposed in the substrate 210 to define an active area 212 including the gate electrode 224, the source region 240, and the drain region 242.

In conclusion, the present disclosure provides a method to facilitate manufacturing the metal contacts at the bottom of the contact holes, while the diameter of the conductive plugs in contact with the metal contacts still meets the design rule or the design guide.

One aspect of the present disclosure provides a semiconductor device. The semiconductor device includes a substrate, a gate electrode, a drain region, a source region, an isolating layer, a plurality of metal contacts, a plurality of conductive plugs, and a contact liner. The gate electrode is disposed on the substrate. The drain region and the source region are disposed in the substrate and on opposite sides of the gate electrode. The isolating layer is disposed over the substrate and the gate electrode. The plurality of metal contacts are disposed in the gate electrode, the source region, and the drain region. The plurality of conductive plugs are disposed in the isolating layer and in contact with the metal contacts. The contact liner surrounds the conductive plugs.

One aspect of the present disclosure provides a method for manufacturing a semiconductor device. The method includes steps of providing a substrate; forming a gate electrode on the substrate; forming a source region and a drain region in the substrate, wherein the source region and the drain region are disposed on opposite sides of the gate electrode; depositing an isolating layer over the substrate and the gate electrode; forming a plurality of contact holes through the isolating layer to expose the gate electrode, the source region, and the drain region; forming a plurality of metal contacts in the gate electrode, the source region, and the drain region; depositing a contact liner in the contact holes; and depositing a conductive material in the contact holes.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate;
   a gate electrode disposed on the substrate;
   a drain region and a source region disposed in the substrate and on opposite sides of the gate electrode;
   an isolating layer disposed over the substrate and the gate electrode, wherein the isolating layer comprises an underlying dielectric layer disposed on the substrate and an overlying dielectric layer disposed over the underlying dielectric layer;
   a plurality of metal contacts disposed in the gate electrode, the source region, and the drain region, wherein the plurality of metal contacts are respectively surrounded by the gate electrode, the source region and the drain region, and a top surface of one of the plurality of metal contacts in the gate electrode is coplanar with an upper surface of the underlying dielectric layer;
   a plurality of conductive plugs disposed in the isolating layer and electrically coupled to the metal contacts; and
   a contact liner surrounding the conductive plugs.

2. The semiconductor device of claim 1, further comprising a barrier layer disposed between the conductive plugs and the contact liner.

3. The semiconductor device of claim 1, wherein
   the underlying dielectric layer is surrounding the gate electrode, the overlying dielectric layer is disposed over the gate electrode.

4. The semiconductor device of claim 3, wherein top surfaces of the other metal contacts in the source region and the drain region are coplanar with a front surface of the substrate.

5. The semiconductor device of claim 1, wherein the metal contacts are metal silicide contacts.

6. The semiconductor device of claim 1, further comprising:
   a gate dielectric disposed between the substrate and the gate electrode; and
   a gate spacer disposed on sidewalls of the gate electrode and the gate dielectric.

7. The semiconductor device of claim 1, further comprising a plurality of isolating regions disposed in the substrate to define and electrically isolate one or more active areas comprising the gate electrode, the source region, and the drain region.

8. The semiconductor device of claim 7, wherein the isolating regions are shallow trench isolation structures.

9. The semiconductor device of claim 1, wherein the source region and the drain region are doping regions.

10. The semiconductor device of claim 1, wherein the contact liner has a uniform thickness.

* * * * *